US010505031B1

(12) United States Patent
Douglas et al.

(10) Patent No.: US 10,505,031 B1
(45) Date of Patent: Dec. 10, 2019

(54) HIGH CURRENT DENSITY, LOW CONTACT RESISTANCE WIDE BANDGAP CONTACTS

(71) Applicant: National Technology & Engineering Solutions of Sandia, LLC, Albuquerque, NM (US)

(72) Inventors: Erica Ann Douglas, Albuquerque, NM (US); Albert G. Baca, Albuquerque, NM (US); Shahed Reza, Albuquerque, NM (US); Michael David Henry, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 16/175,085

(22) Filed: Oct. 30, 2018

(51) Int. Cl.
| H01L 29/778 | (2006.01) |
| H01L 29/10 | (2006.01) |
| H01L 29/43 | (2006.01) |
| H01L 29/205 | (2006.01) |
| H01L 29/20 | (2006.01) |
| H01L 29/66 | (2006.01) |

(52) U.S. Cl.
CPC ...... H01L 29/7787 (2013.01); H01L 29/1029 (2013.01); H01L 29/2003 (2013.01); H01L 29/205 (2013.01); H01L 29/432 (2013.01); H01L 29/66462 (2013.01)

(58) Field of Classification Search
CPC ........... H01L 29/7787; H01L 29/66462; H01L 29/432; H01L 29/66431; H01L 29/7786; H01L 29/778; H01L 29/7782; H01L 29/7781; H01L 2924/13064
See application file for complete search history.

(56) References Cited

U.S. PATENT DOCUMENTS 10,262,931 B2 * 4/2019 Adams .............. H01L 21/76898

OTHER PUBLICATIONS

Baca, A.G. et al., "An AlN/Al0.85Ga0.15N high electron mobility transistor", Applied Physics Letters (2016), vol. 109, pp. 033509-1-033509-4.
Burm, J. et al., "Ultra-low resistive ohmic contacts on n-GaN using Si implantation", Applied Physics Letters (1997), vol. 70, pp. 464-466.

(Continued)

*Primary Examiner* — Hsien Ming Lee
(74) *Attorney, Agent, or Firm* — Mark A. Dodd

(57) ABSTRACT

A high current density, low contact resistance contact for wide bandgap (WBG) or ultra-wide bandgap materials (UWBG) is disclosed. The contact is lithographically formed so that a total perimeter length of the contact structure is at least twice the length of the side of a contact pad closest to the gate in a high electron mobility transistor (HEMT). The contact structure may take the form of a plurality of columns having various cross-sectional shapes, or may take the form of a convoluted geometrical shape, such as a comb-like, serpentine, or spiral shape. The depth of the contact structure permits direct contact with the two-dimensional electron gas (2DEG) in the HEMT by the perimeter of the contact structure. The contact structure is formed of at least one metal layer, at least one doped material regrown layer, or at least one implanted region. The contact structure may be applied to other WBG and UWBG devices.

20 Claims, 6 Drawing Sheets

(56) References Cited

OTHER PUBLICATIONS

Fontserè, A. et al., "Micro and nano analysis of 0.2 X mm Ti/Al/Ni/Au ohmic contact to AlGaN/GaN", Applied Physics Letters (2011), vol. 99, pp. 213504-1-213504-3.

Lin, M.E. et al., "Low resistance ohmic contacts on wide band-gap GaN", Applied Physics Letters (1994), vol. 64, pp. 1003-1005.

Mohammed, F.M. and Wang, L., "Ohmic contact formation mechanism of Ta/Al/Mo/Au and Ti/Al/Mo/Au", metallizations on AlGaN/GaN HEMTs, J. Vac. Sci. Technol. B (2005), vol. 23(6), pp. 2330-2335.

Mohammed, F.M. et al., "First-layer Si metallizations for thermally stable and smooth Ohmic contacts for AlGaN/GaN high electron mobility transistors", J. Vac. Sci. Technol. B (2007), vol. 25(2), pp. 324-333.

Wang, L. et al., "Direct contact mechanism of Ohmic metallization to AlGaN/GaN heterostructures via Ohmic area recess etching", Applied Physics Letters (2009), vol. 95, pp. 172107-1-172107-3.

* cited by examiner

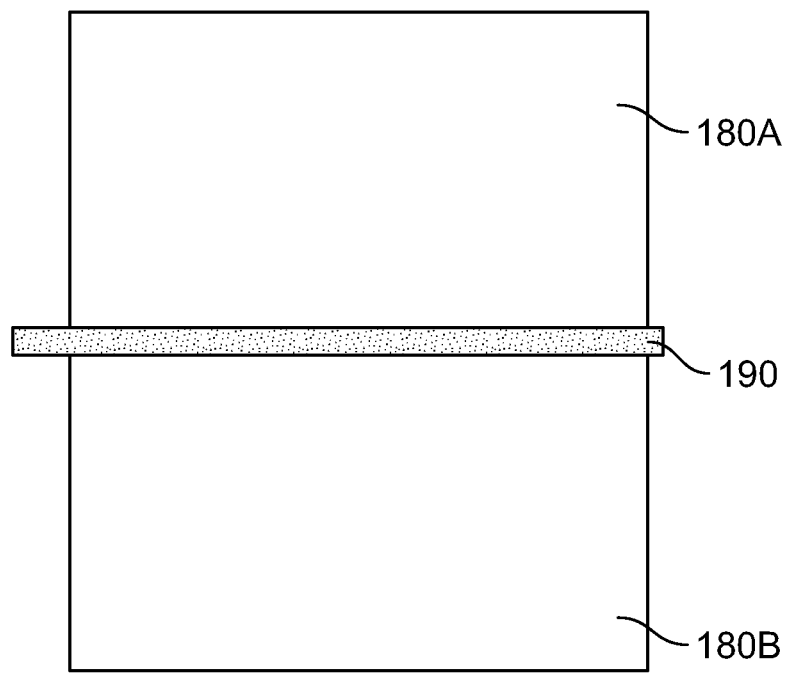
FIG. 1C
(Prior Art)
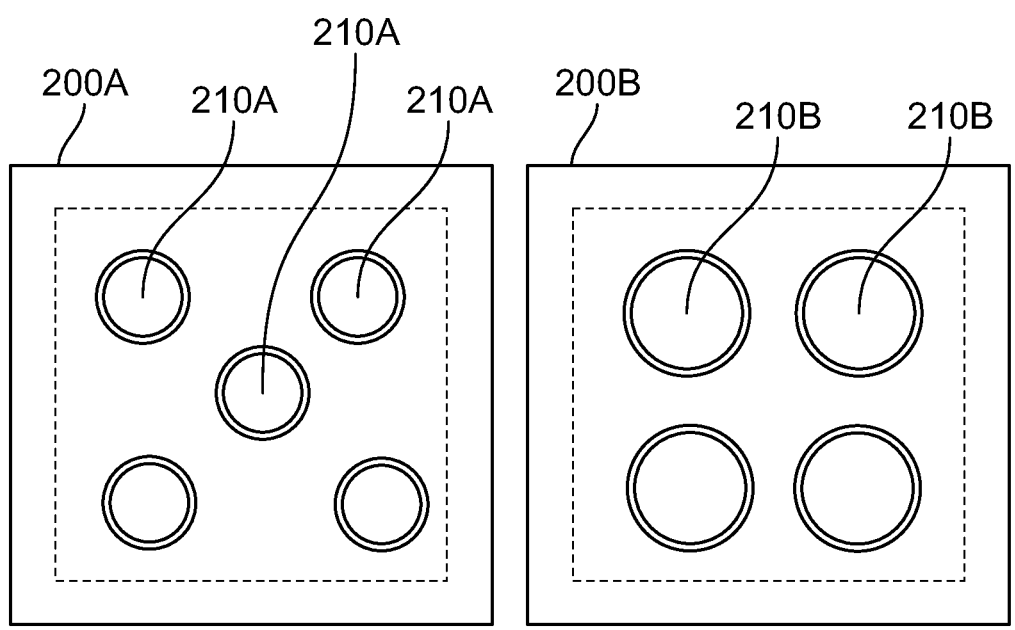
FIG. 2A    FIG. 2B

HIGH CURRENT DENSITY, LOW CONTACT RESISTANCE WIDE BANDGAP CONTACTS

STATEMENT OF GOVERNMENT INTEREST

This invention was made with Government support under Contract No. DE-NA0003525 awarded by the United States Department of Energy/National Nuclear Security Administration. The Government has certain rights in the invention.

TECHNICAL FIELD

The present invention relates to contacts for use with wide and ultra-wide bandgap semiconductors providing high current densities and low contact resistances.

BACKGROUND (Al)GaN-based high electron mobility transistors (HEMTs) are needed as the next generation of high power devices which could transform the current US electrical grid into a more stable and reliable power distribution network. GaN- and AlGaN-based HEMTs are excellent candidates for these high-power applications due to their material properties such as high electron saturation velocity, thermal conductivity, wide bandgap (WBG), and high critical electric field. Furthermore, in order to increase the capability for high power applications requiring several kV, there has been enhanced interest in pursuing materials systems with higher critical electric field and lower on-state resistance, such as ultra-wide bandgap (UWBG) materials with bandgaps approaching 6 eV. See A. G. Baca et al., "An AlN/Al$_{0.85}$Ga$_{0.15}$N high electron mobility transistor," Appl. Phys. Lett., Vol. 109, PP. 033509-1 to 033509-4 (2016), which is incorporated herein by reference.

It has been postulated that there are two main routes for low resistance Ohmic contact formation for (Al)GaN: low Schottky barrier contacts and tunneling contacts. See M. E. Lin et al., "Low resistance ohmic contacts on wide band-gap GaN," Appl. Phys. Lett., Vol. 64, No. 8, PP. 1003 to 1005 (1994), which is incorporated herein by reference. The low Schottky barrier contacts can be formed during high temperature anneals of the Ohmic metallization, in which the interfacial reaction between the metals and the underlying semiconductor results in reaction islands, or spikes, driving down to the heterostructure interface resulting in direct contact with the two-dimensional electron gas (2DEG) layer. See F. M. Mohammed and L. Wang, "Ohmic contact formation mechanism of Ta/Al/Mo/Au and Ti/Al/Mo/Au metallizations on AlGaN/GaN HEMTS," J. Vac. Sci. Tech. B, Vol. 23, No. 6, PP. 2330 to 2335 (2005); F. M. Mohammed et al., "First-layer Si metallizations for thermally stable and smooth Ohmic contacts for AlGaN/GaN high electron mobility transistors," J. Vac. Sci. Tech. B, Vol. 25, No. 2, PP. 324 to 333 (2007); A. Fontserè et al., "Micro and nano analysis of 0.2 Ωmm Ti/Al/Ni/Au ohmic contact to AlGaN/GaN," Appl. Phys. Lett., Vol. 99, PP. 213504-1 to 213504-3 (2011); each of which is incorporated herein by reference. This reaction results in a very uncontrolled method for making direct metal contact to the 2DEG layer, with Fontserè et al. estimating only 5% of the total metal area is in contact with the 2DEG layer. See A. Fontserè et al., Appl. Phys. Lett., Vol. 99, at 213504-3.

Decreased contact resistance with a recessed Ohmic metallization has been previously reported for AlGaN/GaN heterostructures. See L. Wang et al., "Direct contact mechanism of Ohmic metallization to AlGaN/GaN heterostructures via Ohmic area recess etching," Appl. Phys. Lett., Vol. 95, PP. 172107-1 to 172107-3 (2009), which is incorporated herein by reference. Wang et al. suggest that the lower contact resistance is due to direct electron conduction to the 2DEG layer at the edges, i.e., periphery, of an Ohmic contact pad.

In spite of these previous efforts, the need still exists for contacts having low resistance, low on-state resistance, and high current density for various devices made from wide and ultra-wide bandgap materials.

SUMMARY

One aspect of the present invention relates to a wide and ultra-wide bandgap material contact with lower resistance, lower on-state resistance, and higher current density using controlled lithographic techniques. The lithographic solution to improving wide and ultra-wide bandgap material contacts employs configurations having significantly increased perimeter length thereby providing increased direct contact area between the contact and the 2DEG layer in a HEMT.

In at least one embodiment of the present invention, a contact comprises a plurality of columns having, for example, a circular cross-section, formed in the same area occupied by a single contact in the prior art. In at least one other embodiment of the present invention, a contact comprises a single convoluted geometric shape having, for example, a comb-like cross-section, is formed in the same area occupied by a single contact in the prior art. In either of these configurations, a significantly increased total perimeter length is formed relative to that of a traditional rectangular contact. A contact having either a plurality of columns or a single convoluted geometrical shape will be termed a "high perimeter length contact."

The high perimeter length contacts, whether a plurality of geometric shapes or a single convoluted geometric shape, may be implemented in various ways. In at least one embodiment of the present invention, the contact(s) are formed by a recess etch into the material to a depth just greater than that of the 2DEG layer in a HEMT, with one or more contact materials, typically metals, conformally deposited in layers on the etched structure. The conformally deposited layers thus directly contact the 2DEG layer around the perimeter of each etched recess. In at least one other embodiment of the present invention, the contact(s) are again formed by a recess etch into the material to a depth just greater than that of the 2DEG layer in a HEMT, with conformal doped material regrown on the etched structure, followed by a top surface contact metallization. As with the conformally deposited contact layers, the conformally regrown material directly contacts the 2DEG layer around the perimeter of each etched recess.

The recess etch may take one of several forms. In at least one embodiment of the present invention, the etch employs a vertical etch, for example, an inductively coupled plasma (ICP) reactive ion etch (RIE), resulting in vertical, or nearly vertical, sidewalls. In at least one other embodiment of the present invention, the etch employs a positive, i.e., not negative or undercut, sloping etch, with the resultant sloping sidewalls providing a potentially greater contact area with the 2DEG layer in a HEMT and better conformal deposition or regrowth. In yet another embodiment of the present invention, the etch process employs two separate etches. The first etch is a vertical or nearly vertical etch that is timed to stop approximately at the top surface of the 2DEG layer. The second etch is a highly positive sloping etch that forms a cone with the apex of the cone approximately at the bottom surface of the 2DEG layer. In a still further embodiment of the invention, an etch process with significant resputtering of the masking material is employed. The resultant highly columnar or "grassy" bottom surface provides a large surface area to the 2DEG layer for either a metallization or a doped material regrowth contact structure.

In yet another embodiment of the present invention, the contact(s) are formed by implanting dopants, for example Si or Mg, into the WBG or UWBG material down to the 2DEG layer in the HEMT, followed by a top surface contact metallization. By proper selection of the dopants, n- or p-type contacts may be formed depending upon the specific application requirements. This additional flexibility is especially useful with light emitting diodes (LEDs), semiconductor lasers, and other bipolar devices fabricated from WBG and UWBG materials.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings.

FIG. 1C illustrates a prior art contact structure.

FIGS. 2A and 2B illustrate plan views of contact structures having two different packing configurations in accordance with various embodiments of the present invention.

DETAILED DESCRIPTION

Figure 1A:
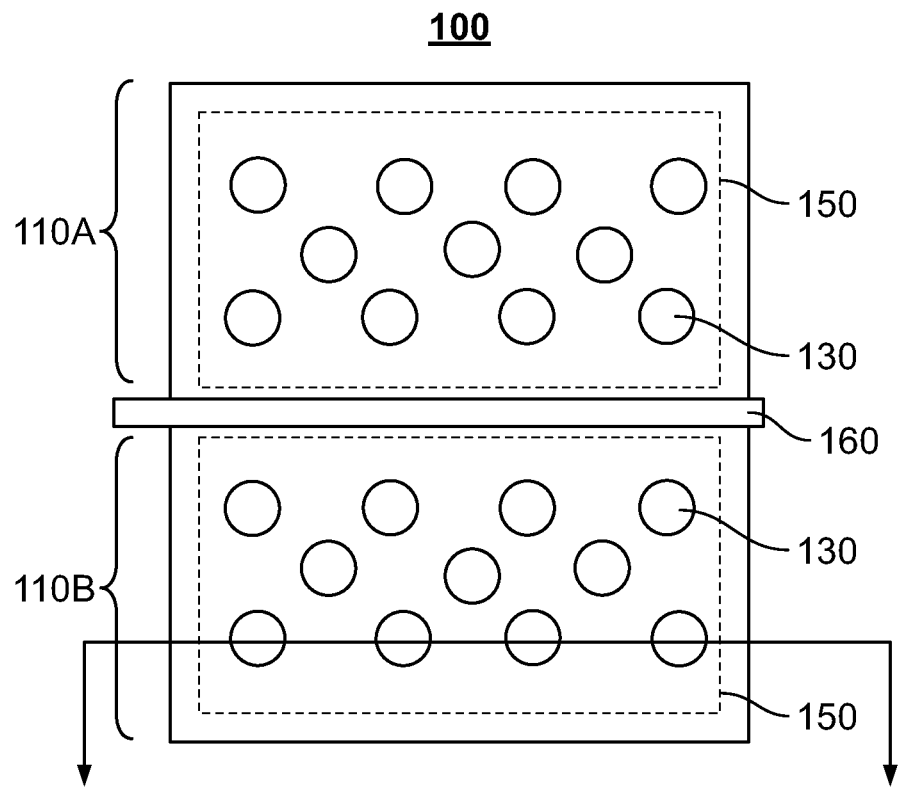
FIGS. 1A and 1B illustrate plan and cross-sectional views, respectively, of a contact structure employing columns in accordance with one or more embodiments of the present invention.
Figure 1B:
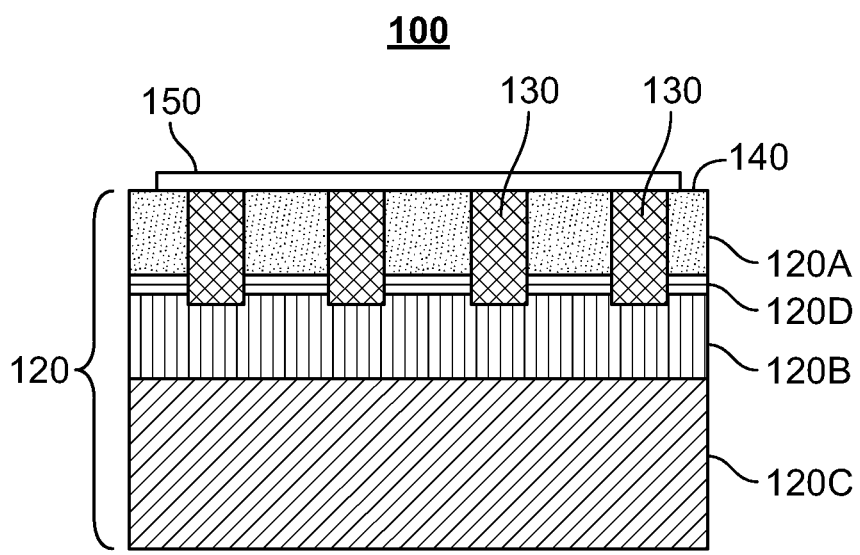

FIGS. 1A and 1B illustrate plan and cross-sectional views, respectively, of at least one embodiment of the present invention as applied to a high electron mobility transistor (HEMT) 100. The HEMT 100 includes first and second contacts 110A, 110B to a wide band gap (WBG) or ultra-wide bandgap (UWBG) semiconductor material layer 120. The semiconductor material layer 120 comprises, for example, a barrier layer 120A and a channel layer 120B formed on a substrate 120C. A two-dimensional electron gas (2DEG) layer 120D forms in the channel layer 120B adjacent the barrier layer 120A. A typical thickness of the 2DEG layer 120D is 1-10 nm. The semiconductor material layer 120 may optionally include a thin spacer layer, not illustrated, between the barrier layer 120A and the channel layer 120B. The semiconductor material layer may also optionally include a thin cap layer, not illustrated, over the barrier layer 120A. The first and second contacts 110A, 110B each include a plurality of columns 130, with each column 130 having a circular cross-section. On the top surface 140 of the semiconductor material 120 is a contact pad 150 electrically connected to the plurality of columns 130. The HEMT 100 also includes a gate electrode 160 between the first and second contacts 110A, 110B.

FIG. 1C illustrates a plan view of a prior art HEMT 170 with contacts 180A, 180B, and a gate electrode 190. A comparison of FIGS. 1A and 1C shows that the first and second contacts 110A, 110B of this embodiment of the present invention occupy the same the area as the contacts 180A, 180B of the prior art, but provide a significantly greater total perimeter length due to the plurality of columns 130.

While the columns 130 of the embodiment illustrated in FIGS. 1A and 1B have a circular cross-section, other cross-sectional shapes are contemplated. As a first example, the cross-sectional shape may be an octagon as a simple straight-line approximation of a circle, which may be more difficult to pattern. Other cross-sectional shapes include other polygons, particularly triangles, squares, and hexagons. Multi-pointed stars having, for example, three, four, five, or more points, are also contemplated as potential cross-sectional shapes. As will be discussed with respect to FIGS. 2A, 2B, and 3, different cross-sectional shapes may provide various advantages in terms of packing configuration and maximizing total perimeter length for a given contact size and shape.

FIGS. 2A and 2B illustrate plan views of two different embodiments of the present invention in which the contacts 200A, 200B both include a plurality of columns 210A, 210B, with each column 210A, 210B having a circular cross-section. The difference between the embodiments illustrated in FIGS. 2A and 2B is the packing configuration of the plurality of columns 210A, 210B. In FIG. 2A, the plurality of columns 210A have an offset row packing configuration, while in FIG. 2B, the columns 210B have a square packing configuration.

Figure 3:
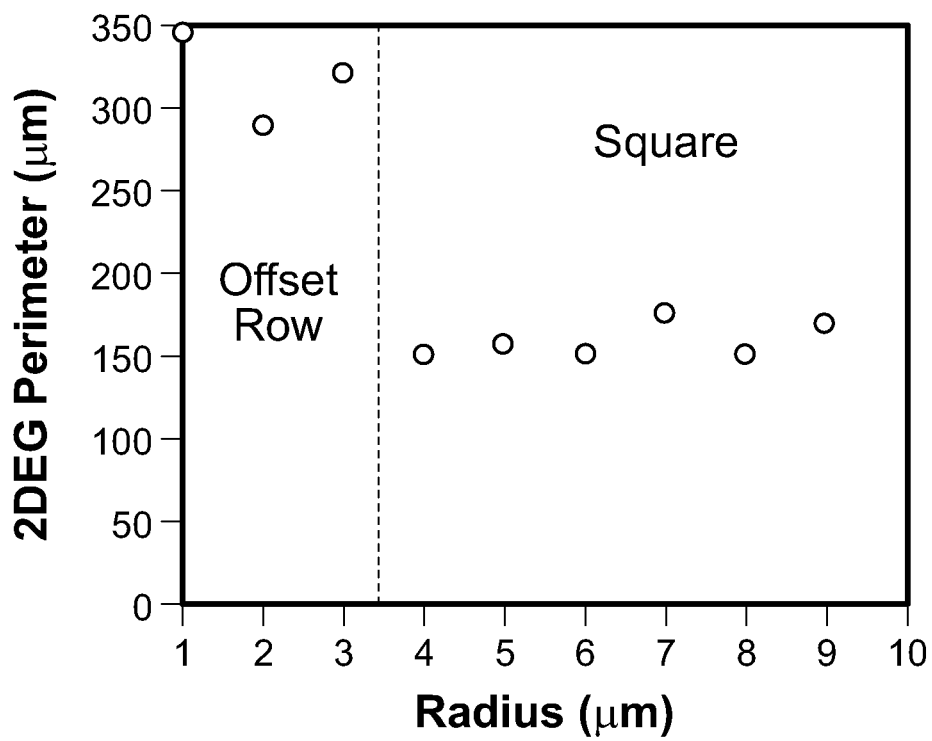
FIG. 3 illustrates the total perimeter length of the plurality of columns in both square and offset row packing configurations in accordance with various embodiments of the present invention as a function of the radius R of the columns.

FIG. 3 illustrates the total perimeter length of the plurality of columns in both offset row and square packing configurations for an overall contact pad size of 22 µm by 68 µm as a function of the radius R of the columns. For radius values of 3 µm or less, the offset row packing configuration provides the greatest total perimeter length. For radius values of 4 µm or more, the offset row packing configuration cannot be supported for a minimum distance δ between adjacent columns 210A of 2 µm, and thus only the total perimeter length for the square packing configuration is illustrated. Given the contact pad size and a minimum distance δ between columns of 2 µm, the maximum supported radius value is 9 µm. For comparison, the total perimeter length for a recess etched prior art contact would be 68 µm, i.e., the length of the side of the contact pad adjacent the gate electrode. Thus, the various embodiments of the present invention with its plurality of columns provide a significantly greater perimeter length than the prior art contact. As shown in FIG. 3, the total perimeter length of the plurality of columns is at least twice the length of the side of the contact pad adjacent the gate electrode, and may be nearly five times the length of the side of the contact pad adjacent the gate electrode.

For various embodiments of the present invention, the minimum radius R of the columns 210A, 210B can be determined by the total carrier density desired, which will be different for a recessed metallization structure versus a doped material regrown structure. A doped material regrown structure will require a larger minimum radius as the effective transfer length will be longer than for embodiments with the metallization structure. See J. Burm et al., "Ultra-low resistive ohmic contacts on n-GaN using Si implantation," Appl. Phys. Lett., Vol. 70, PP. 464 to 466 (1997), which is incorporated herein by reference. In addition, the minimum distance δ between the columns 210A, 210B will be governed by material properties of the heterostructure.

Figure 4:
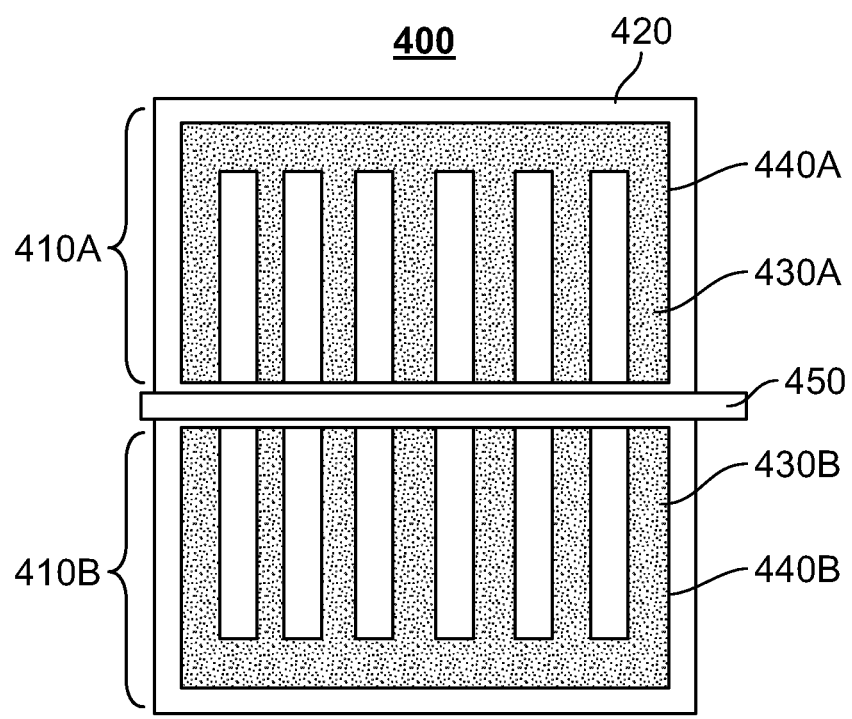
FIG. 4 illustrates a plan view of a contact structure employing a convoluted geometrical shape in accordance with one or more embodiments of the present invention.

FIG. 4 illustrates a plan view of at least one embodiment of the present invention as applied to a HEMT 400. The HEMT 400 includes first and second contacts 410A, 410B to a wide or ultra-wide bandgap semiconductor material 420. The first and second contacts 410A, 410B each include a single convoluted geometric shape contact 430A, 430B with each convoluted geometrical shape contact 430A, 430B having a comb-like cross-section. On the top surface of the semiconductor material 420 are contact pads 440A, 440B electrically connected to corresponding convoluted geometrical shape contacts 430A, 430B. The HEMT 400 also includes a gate electrode 450 between the first and second contacts 410A, 410B. A comparison of FIGS. 4 and 1C shows that the first and second contacts 410A, 410B of this embodiment of the present invention occupy the same the area as the contacts 180A, 180B of the prior art.

While the convoluted geometric shape contacts 430A, 430B of the embodiment illustrated in FIG. 4 have a comb-like cross-section, other cross-sectional shapes are contemplated. For example, the cross-sectional shape may be serpentine or spiral. While the serpentine and spiral cross-sectional shapes may yield total perimeter lengths similar to the comb-like cross-section, it is expected that the serpentine and spiral shapes may create some carrier shielding between the contact and the gate electrode in a HEMT, thereby effectively reducing the total perimeter lengths of these designs, at least for HEMTs with rectangular gate electrodes.

Figure 5:
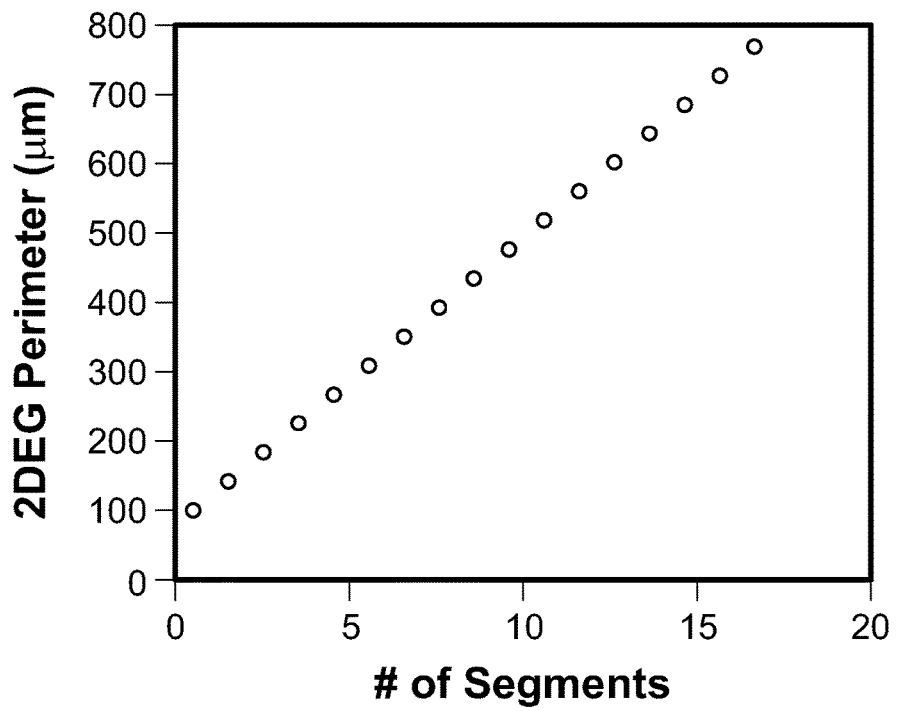
FIG. 5 illustrates the total perimeter length of the comb-like convoluted geometrical shape contact in accordance with one or more embodiments of the present invention as a function of the number of teeth.

FIG. 5 illustrates the total perimeter length of a convoluted geometrical shape contact having a comb-like cross-section for an overall contact pad size of 22 μm by 68 μm as a function of the number of teeth with a tooth width of 2 μm. Given the contact pad size, a tooth width of 2 μm and a minimum spacing between teeth of 2 μm, the maximum number of teeth is 17. As the total perimeter length for a recess etched prior art contact, i.e., the length of the side of the contact pad adjacent the gate electrode, would be 68 μm, the convoluted geometrical shape contact embodiment of the present invention with a comb-like cross-section can provide more than a factor of ten increase in the total perimeter length over the prior art contact.

Figure 6A:
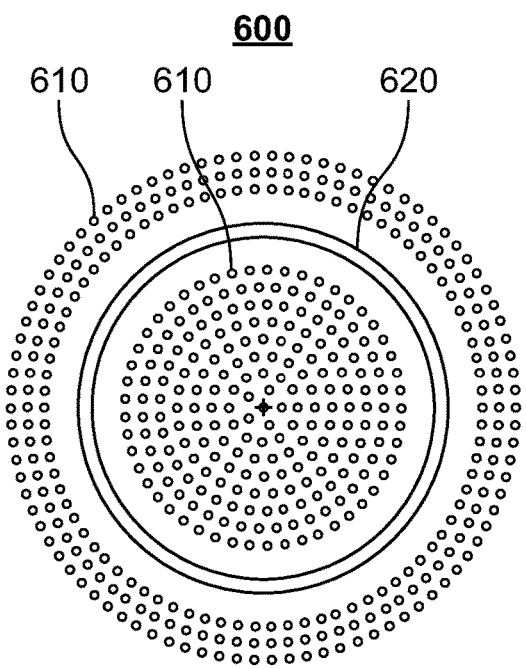
FIGS. 6A and 6B illustrate the application of circular columns and the convoluted geometrical shape contact, respectively, to non-rectangular devices in accordance with various embodiments of the present invention.
Figure 6B:
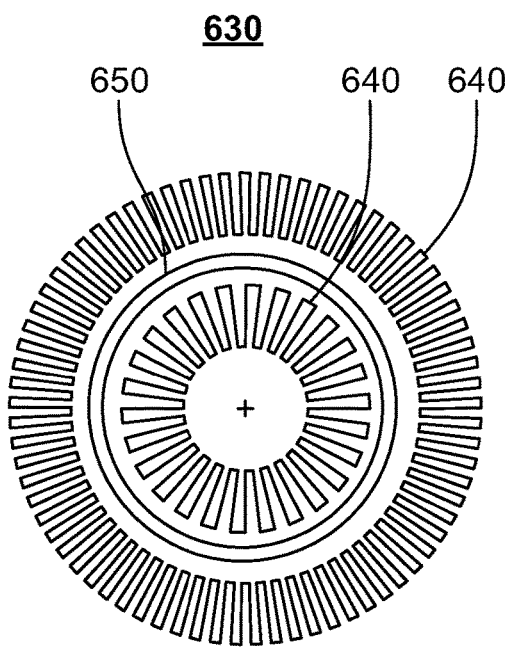

FIGS. 6A and 6B illustrate the application of both the circular columns (FIG. 6A) and the convoluted geometrical shape contact (FIG. 6B) to non-rectangular devices. In FIG. 6A, circular columns 610 are employed for a circular HEMT 600, with a circular gate electrode 620. As with the circular column designs illustrated in FIGS. 2A and 2B, the spacing and size of the individual circular columns 610 can be designed to meet the needs of a specific application. While FIG. 6A illustrates the use of circular columns 610, columns having other cross-sectional shapes are contemplated, for example, polygons including triangles, squares, hexagons, and octagons, as well as stars having various numbers of points.

In FIG. 6B, convoluted geometrical shape contacts 640 are employed for a circular HEMT 630, with a circular gate electrode 650. As with the convoluted geometrical shape contact designs illustrated in FIG. 4, the spacing and size of the individual convoluted geometrical shape contacts 640 can be designed to meet the needs of a specific application. While FIG. 6B illustrates the use of convoluted geometrical shape contacts 640 having a serpentine pattern, other cross-sectional shapes are contemplated, for example, a comb design with the teeth of the center contact facing outward with the teeth of the outer contact facing toward the center.

Figure 7A:
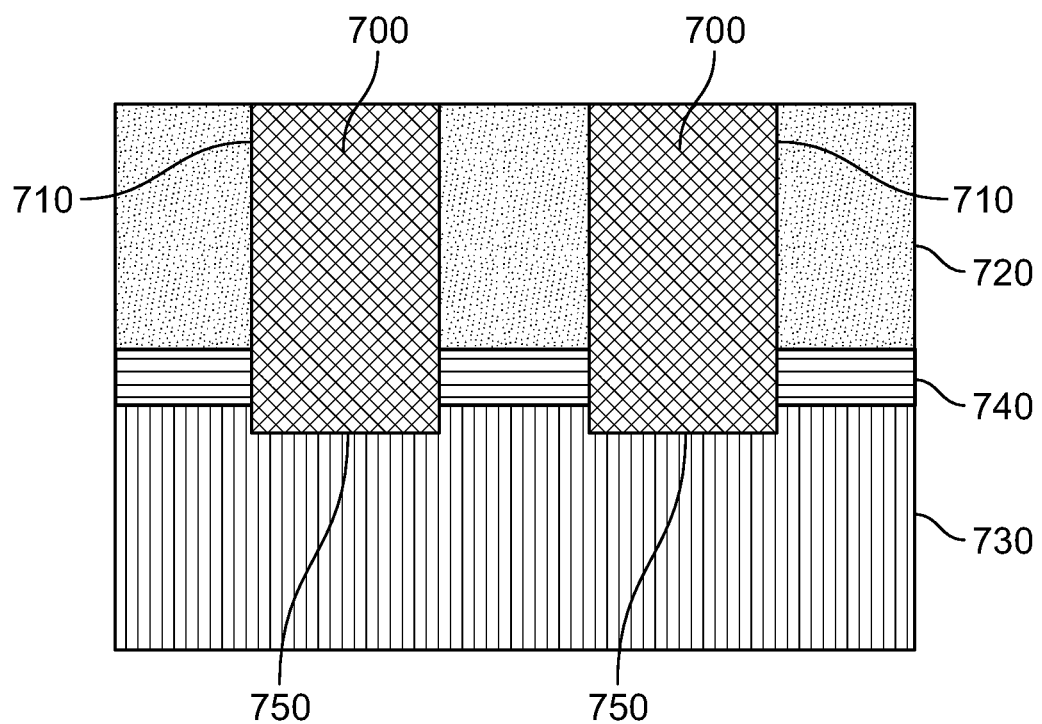
FIGS. 7A-7C illustrate three different potential cross-sectional shapes for the columns based upon three different recess etching processes in accordance with various embodiments of the present invention.
Figure 7B:
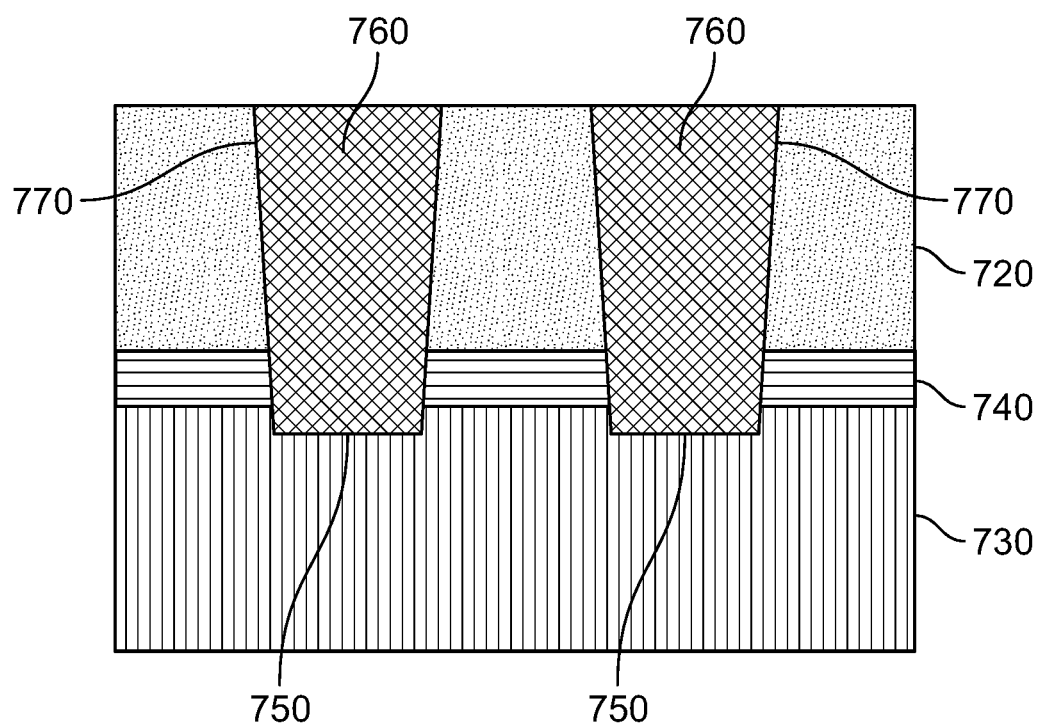
Figure 7C:
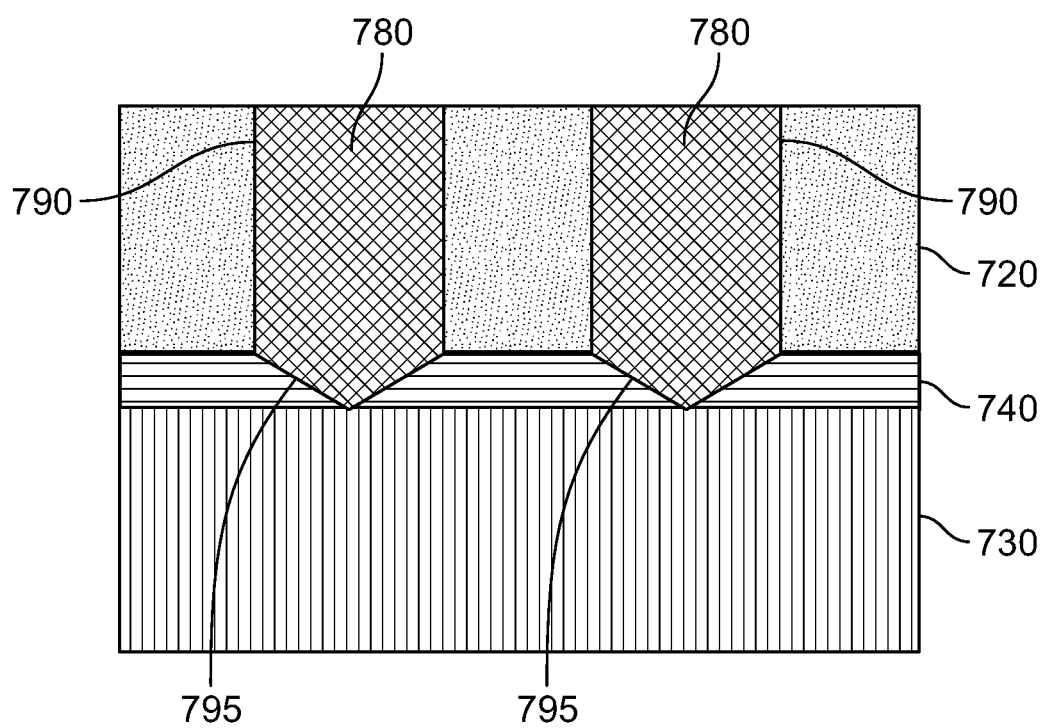

FIGS. 7A-7C illustrate three different potential vertical cross-sectional shapes for the columns based upon three different recess etching processes as applied to a HEMT. FIG. 7A illustrates columns 700 in accordance with at least one embodiment based upon a first recess etching process. The first etching process employs a single etch step that forms vertical, or substantially vertical, sidewalls 710. The etch is of sufficient duration to go through the barrier layer 720 and into the channel layer 730 below the 2DEG layer 740 formed in the channel layer 730 adjacent to the barrier layer 720. The bottom 750 of the column 700 has a horizontal or substantially horizontal surface. While the first etching process is potentially the simplest of the three etching processes, the vertical sidewalls 710 may create difficulties during deposition or regrowth of the subsequent contact materials on the etched structure.

FIG. 7B illustrates columns 760 in accordance with at least one embodiment based upon a second recess etching process. The second etching process employs a single etch step that forms positive, i.e., not negative or undercut, sloping sidewalls 770. The etch is of sufficient duration to go through the barrier layer 720 and into the channel layer 730 below the 2DEG layer 740 formed in the channel layer 730 adjacent to the barrier layer 720. The bottom 750 of the column 760 is a horizontal or substantially horizontal surface. While the second etching process may potentially be more complex than the first etching process, the sloping sidewalls 770 should simplify deposition or regrowth of the subsequent contact materials on the etched structure.

FIG. 7C illustrates columns 780 in accordance with at least one embodiment based upon a third recess etching process. The third etching process employs two etch steps. The first etch step forms vertical or slightly positive sloping sidewalls 790. The first etch step is of sufficient duration to stop at approximately the top of the 2DEG 740 formed in the channel layer 730 adjacent to the barrier layer 720. The second etch step forms a strongly positive sloping bottom 795. The second etch step is of sufficient duration to stop at approximately the bottom of the 2DEG layer 740, thereby preferably forming a cone at the bottom 795 of the contact column 770. When this third recess etching process is applied to a convoluted geometrical shape contact, the bottom of the contact has a V-shape.

The third etching process is the most complex of the three etching processes, but provides by far the greatest potential contact area to the 2DEG layer 740. The first and second etching processes provide a contact area of the perimeter, i.e., $2\pi R$, times the height of the 2DEG layer 740, i.e., H. For a radius R of 1 μm and a 2DEG layer 740 height H of 3 nm, the contact area is 0.0188 μm². In contrast, for the cone formed in the third etching process, the contact area to the 2DEG layer 740 is $\pi R \sqrt{(R^2+H^2)}$. Using the same R and H values, the third etching process yields a contact area of 3.1416 µm². A person of ordinary skill in the art is thus faced with a classical engineering trade-off of process complexity (one etch step versus two etch steps) with performance (small contact area versus large contact area).

The recess etching processes illustrated in FIGS. 7A-7C may be implemented, in various embodiments, as either a wet etching process, a dry etching process, for example, a reactive ion etching (RIE) process, or a combination of wet and dry etching processes. The chemistry used in the wet etching process or the dry etching process will depend upon the materials used to form the WBG or UWBG device structure.

The recess etching process may also be implemented, in various embodiments, as either a timed etching process, a selective etching process, or a combination of timed and selective etching processes, especially for the third recess etching process illustrated in FIG. 7C. The use of a selective etching process is preferably employed to stop etching on the 2DEG layer 740, when this is possible.

Figure 8:
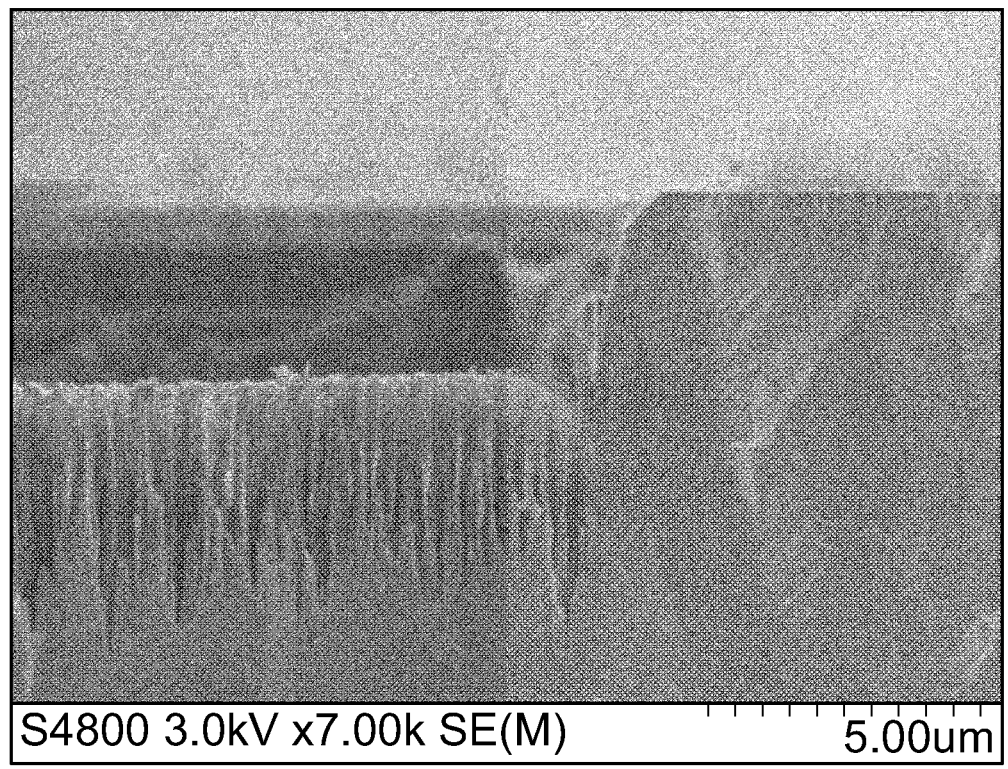
FIG. 8 is a photomicrograph of the results of using a fourth recess etching process in accordance with at least one embodiment of the present invention.

FIG. 8 is a photomicrograph of the results of using an etch process employed by at least one embodiment based upon a fourth recess etching process. The fourth etching process is a dry etching process that beneficially employs resputtering of the masking material, which is typically detrimental to an etching process. In this case, the columnar or "grassy" bottom surface resulting from the etching process provides significant surface area to the 2DEG layer. By subsequently employing either a metallization structure or a doped material regrown structure, the resultant contact will have significant surface contact to the 2DEG layer, resulting in increased current densities and lower contact resistances. This etching process is termed a "resputtering etching process."

In at least one embodiment of the invention, the target etch depth for the first through fourth recess etching processes may be less than the thickness of the barrier layer 720, i.e., only partially through the barrier layer 720 and not down to the 2DEG layer 740. In this embodiment, the target etch depth is preferably up to about 90% of the thickness of the barrier layer 720.

In various embodiments of the invention, the contact structure can be tailored to target a specific current density or on-resistance depending upon the application. This tailoring is a traditional engineering trade-off for one of ordinary skill in the art. For example, if the device is a simple power switch, one may not need to make the process unnecessarily complicated as a reasonably low contact resistance may suffice. However, if the device is a very high power switch or must have very fast switching times, then a more complicated process that minimizes contact resistance may be warranted.

In at least one embodiment of the present invention, one or more contact materials, typically metals, are conformally deposited in layers on the recess etched structure. These conformally deposited layer(s) may comprise, for example, Ta, Al, Mo, Ni, Au, Ti, V, Ir, and Si. While the specific layer compositions and thicknesses are a function of the WBG or UWBG material used to form the device structure, an example contact structure may comprise Ti (15 nm)/Al (60 nm)/Mo (35 nm)/Au (50 nm). The conformally deposited layer(s) may be deposited by physical vapor deposition, for example evaporation, or a chemical vapor deposition process. The devices are preferably subjected to a rapid thermal anneal (RTA) process. This RTA process preferably has a duration of 30 seconds, and is conducted in a nitrogen ambient at a temperature of 600° C. to 850° C., though longer and shorter durations and higher or lower temperatures may be used depending upon the specific WBG/UWBG material.

In at least one embodiment, a contact pad is formed on the top surface of the conformally deposited layer(s). In this case, the conformally deposited layer(s) may optionally be planarized prior to forming the contact pad. The contact pad is preferably formed by depositing and lifting-off a metal layer, for example, Au. In at least one other embodiment, a contact pad is formed from the conformally deposited layer(s). In this embodiment, portions of the conformally deposited layer(s) on the top surface of the semiconductor material layer are patterned to form the desired contact pads.

In at least one embodiment of the present invention, one or more doped material regrown layers are conformally deposited on the recess etched structure. These conformally deposited doped material regrown layer(s) may comprise, for example, the same or different WBG or UWBG material composition(s) as those used to form the underlying device structure. To increase the current density and reduce the contact resistance, the doping level(s) in the one or more doped material regrown layer(s) is preferably higher than that employed in the underlying device structure. The one or more doped material regrown layer(s) are preferably deposited using a chemical vapor deposition process.

In at least one embodiment, a contact pad is formed on the top surface of the doped material regrown layer(s). In this case, the doped material regrown layer(s) may optionally be planarized prior to forming the contact pad. The contact pad is preferably formed by depositing and lifting-off one or more contact material layers. These deposited contact material layer(s) may comprise, for example, Ta, Al, Mo, Ni, Au, Ti, V, Ir, and Si. While the specific contact material layer compositions and thicknesses are a function of the material used to form the doped material regrown layer(s), an example contact structure may comprise Ti (15 nm)/Al (60 nm)/Mo (35 nm)/Au (50 nm). The deposited contact material layer(s) may be deposited by physical vapor deposition, for example evaporation, or a chemical vapor deposition process. The devices are preferably subjected to a rapid thermal anneal (RTA) process. This RTA process preferably has a duration of 30 seconds, and is conducted in a nitrogen ambient at a temperature of 600° C. to 850° C., though longer and shorter durations and higher or lower temperatures may be used depending upon the specific WBG/UWBG material In at least one embodiment, the columns 130 are formed by implanting the semiconductor material layer 120 with dopants through a mask having the desired high perimeter length contact pattern, thereby forming one or more implanted regions. As with the recess etched embodiments, the implanted regions may extend all the way to the 2DEG layer 120D or may extend only partially through the barrier layer 120A. As one may select the dopant species, one can create either n-type or p-type implanted regions depending upon the device. For example, bipolar devices, such as LEDs and lasers, which have both n- and p-type layers, may use both n- and p-type implanted regions. While the specific dopant species depends upon the WBG or UWBG material being used, for GaN and AlGaN materials, Si is preferably used as an n-type dopant, while Mg is preferably used as a p-type dopant. Devices employing implanted regions preferably undergo an annealing process to heal the damage caused by the implanting process and to activate the implanted dopants. Devices employing implanted regions will preferably include a contact pad formed on the top surface of the implanted regions.

While various embodiments of the invention have generally been described in conjunction with a HEMT, the high current density, low contact resistance contacts of the subject invention may be employed with other WBG and UWBG devices. For example, the high current density, low contact resistance contacts of the subject invention may be employed with high-power devices, high operating temperature devices, high frequency devices, power converters, LEDs, and semiconductor lasers fabricated from WBG and UWBG materials. Further, the high current density, low contact resistance contacts of the subject invention may be employed with transducers that make use of the piezoelectric effect found in many WBG and UWBG materials, for example, AlN. These non-HEMT devices will generally have a different WBG or UWBG semiconductor material layer than the HEMT device illustrated in FIG. 1B. For example, a light emitting diode will typically have a semiconductor material layer comprising a substrate, an n-type contact layer, an active layer, and a p-type layer. Thus, the semiconductor material layer will depend upon the specific type of WBG or UWBG device desired.

As an example, a non-HEMT device formed of a WBG or UWBG material may employ one or more contacts in accordance with an embodiment of the present invention. Assuming this non-HEMT device employs a contact pad having the same size as the HEMT example discussed above, i.e., the contact pad is 22 μm by 68 μm, a high perimeter contact employing a plurality of columns would preferably have a total perimeter length that is at least 1.5 times greater than the total perimeter length of the contact pad. In this case, any of the three offset row packing configurations shown in FIG. 3 would satisfy this preferred ratio. Similarly, a non-HEMT device having a 22 μm by 68 μm contact pad in combination with a convoluted geometrical shape contact would preferably have a total perimeter length that is at least 3 times greater than the total perimeter length of the contact pad. In this case, a comb-like convoluted geometrical shape contact having at least twelve teeth, as shown in FIG. 5, would satisfy this preferred ratio.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A semiconductor device comprising:
a semiconductor material layer;
a high perimeter length contact formed in a top surface of the semiconductor material layer;
a contact pad formed on a top surface of the high perimeter length contact and a first portion of the top surface of the semiconductor material layer, the contact pad electrically connected to the high perimeter length contact; and
a gate electrode formed on a second portion of the top surface of the semiconductor material layer, the second portion of the top surface of the semiconductor material layer different than the first portion of the top surface of the semiconductor material layer, the gate electrode being adjacent the contact pad;
wherein a total perimeter length of the high perimeter length contact is at least 2 times greater than a length of a side of the contact pad closest to the gate electrode.

2. The semiconductor device of claim 1, wherein the high perimeter length contact includes a plurality of columns, each of the plurality of columns having one of a circular cross-sectional shape, a polygonal cross-sectional shape, and a multi-pointed star cross-sectional shape.

3. The semiconductor device of claim 1, wherein the high perimeter length contact includes a plurality of columns, the plurality of columns having an offset row packing configuration or a square packing configuration.

4. The semiconductor device of claim 1, wherein the high perimeter length contact includes a plurality of columns, the total perimeter length of the high perimeter length contact being at least 4 times greater than the length of the side of the contact pad closest to the gate electrode.

5. The semiconductor device of claim 1, wherein the high perimeter length contact includes a convoluted geometrical shape contact, the convoluted geometrical shape contact having one of a comb-like cross-section, a serpentine cross-section, and a spiral cross-section, the total perimeter length of the convoluted geometrical shape contact being at least 5 times greater than the length of the side of the contact pad closest to the gate electrode.

6. The semiconductor device of claim 5, wherein the total perimeter length of the convoluted geometrical shape contact is at least 10 times greater than the length of the side of the contact pad closest to the gate electrode.

7. The semiconductor device of claim 1, wherein a sidewall of the high perimeter length contact is one of vertical, substantially vertical, and a positive slope.

8. The semiconductor device of claim 1, wherein the gate electrode is a rectangle or a ring.

9. The semiconductor device of claim 1, wherein the contact pad is one of a rectangle, a circle, and a ring.

10. The semiconductor device of claim 1, wherein the semiconductor material layer includes:
a barrier layer; and
a channel layer, the channel layer on a side of the barrier layer opposite the top surface of the semiconductor material layer.

11. The semiconductor device of claim 10, wherein the semiconductor material layer further includes one or more of a spacer layer between the barrier layer and the channel layer and a cap layer on the barrier layer.

12. The semiconductor device of claim 10, wherein a thickness of the high perimeter length contact is substantially equal to or greater than a thickness of the barrier layer.

13. The semiconductor device of claim 1, wherein the high perimeter length contact comprises one of at least one metal layer, at least one doped material regrown layer, and at least one implanted region.

14. The semiconductor device of claim 1, wherein the high perimeter length contact and the contact pad comprise the same material.

15. The semiconductor device of claim 1, wherein the semiconductor material layer comprises a wide bandgap semiconductor material or an ultra-wide bandgap material.

16. A semiconductor device comprising:
a semiconductor material layer;
a high perimeter length contact formed in a top surface of the semiconductor material layer; and
a contact pad formed on a top surface of the high perimeter length contact and a portion of the top surface of the semiconductor material layer, the contact pad electrically connected to the high perimeter length contact;

wherein a total perimeter length of the high perimeter length contact is at least 1.5 times greater than a total perimeter length of the contact pad.

17. The semiconductor device of claim 16, wherein the high perimeter length contact includes a plurality of columns, each of the plurality of columns having one of a circular cross-sectional shape, a polygonal cross-sectional shape, and a multi-pointed star cross-sectional shape.

18. The semiconductor device of claim 16, wherein the high perimeter length contact includes a plurality of columns, the plurality of columns having an offset row packing configuration or a square packing configuration.

19. The semiconductor device of claim 16, wherein the high perimeter length contact includes a convoluted geometrical shape contact, the convoluted geometrical shape contact having one of a comb-like cross-section, a serpentine cross-section, and a spiral cross-section, the total perimeter length of the convoluted geometrical shape contact being at least 3 times greater than the total perimeter length of the contact pad.

20. The semiconductor device of claim 16, wherein the high perimeter length contact comprises one of at least one metal layer, at least one doped material regrown layer, and at least one implanted region.

\* \* \* \* \*